United States Patent
Liu et al.

(10) Patent No.: US 7,333,339 B2
(45) Date of Patent: Feb. 19, 2008

(54) HEAT DISSIPATION SYSTEM FOR A MINIATURIZED FORM FACTOR COMMUNICATIONS CARD

(75) Inventors: Guo Tao Liu, Hangzhou (CN); Shanquan Bao, Alameda, CA (US); Taojin Le, Hangzhou (CN); William X. Huang, San Ramon, CA (US); Meng-en Tan, Hangzhou (CN)

(73) Assignee: UTStarcom, Inc., Alameda, CA (US)

( * ) Notice: Subject to any disclaimer, the term of this patent is extended or adjusted under 35 U.S.C. 154(b) by 0 days.

(21) Appl. No.: 11/308,673

(22) Filed: Apr. 20, 2006

(65) Prior Publication Data

US 2007/0247815 A1    Oct. 25, 2007

(51) Int. Cl.
*H05K 7/20* (2006.01)

(52) U.S. Cl. ............... 361/715; 361/709; 361/719; 361/814; 257/712; 455/254; 455/575.1

(58) Field of Classification Search .......... 361/702, 361/704–709, 712–717, 719–724, 736, 752, 361/782, 772, 785; 257/706–712, 717–722; 330/265, 277; 359/341.1, 341.4, 337; 455/15, 455/141, 575, 254, 561; 165/80.3, 253; 136/203; 333/995, 99 R; 343/890, 891, 700 MS, 872

See application file for complete search history.

(56) References Cited

U.S. PATENT DOCUMENTS

| | | | | |
|---|---|---|---|---|
| 6,011,690 A | * | 1/2000 | Hughes et al. | ............... 361/704 |
| 6,031,718 A | * | 2/2000 | Suzuki et al. | ............... 361/695 |
| 6,243,578 B1 | | 6/2001 | Koike | |
| 6,891,726 B1 | * | 5/2005 | Montoya | ............... 361/704 |
| 6,961,245 B2 | * | 11/2005 | Ikuta et al. | ............... 361/719 |
| 6,965,515 B2 | * | 11/2005 | Alford et al. | ............... 361/709 |
| 7,149,481 B2 | * | 12/2006 | Okako et al. | ............... 455/90.3 |
| 7,248,475 B2 | * | 7/2007 | Paydar et al. | ............... 361/695 |

\* cited by examiner

*Primary Examiner*—Michael Datskovskiy
(74) *Attorney, Agent, or Firm*—Felix L. Fischer

(57) ABSTRACT

A heat dissipation system for a miniaturized form factor card allows a communications system for mobile information devices contained in the card to operate with high heat loads by employing a high conductivity pad on the printed circuit board of the mobile information device which contacts the case of the miniaturized form factor card. Additionally, heat dissipation plugs are integrated into the edge of the PCB with emitting surfaces adjacent radiation holes in the case of the mobile information device adjacent the PCB. Heat convection channels through layers of the PCB allow transfer of heat from the pad to other conductive layers in the PCB. High thermal conductivity packing in the miniaturized form factor card conducts heat from the internal components to the case of the card in contact with the high conductivity. Placement of high heat generation components within the card case adjacent the contact interface with the high conductivity pad is also employed for maximum heat dissipation. A high conductivity membrane is provided on the card case for increased conductivity from the case into the pad on the PCB.

9 Claims, 2 Drawing Sheets

HEAT DISSIPATION SYSTEM FOR A MINIATURIZED FORM FACTOR COMMUNICATIONS CARD

REFERENCE TO RELATED APPLICATIONS

This application is co-pending with U.S. application Ser. No. 11/308,221 filed on Mar. 13, 2006 entitled MINIATURIZED FORM FACTOR WIRELESS COMMUNICATIONS CARD FOR GENERIC MOBILE INFORMATION DEVICES and having the same assignee as the present application.

BACKGROUND OF THE INVENTION

1. Field of the Invention

This invention relates generally to the field of operating platforms for mobile phones and personal data systems and more particularly to a heat dissipation system to be employed with generic mobile information devices for a wireless communications card with a miniaturized form factor which is insertable into the mobile information devices to accommodate desired wireless communication functions.

2. Related Art

Current design time-to-market for mobile phone and personal information devices is extended due to current design philosophy and practice. Turn-around time for a typical complete handset design is about 9 months. Currently terminal vendors need to spend significant amount of resources on basic wireless communication functions and cannot concentrate on truly value-added design works, such as industrial design and software applications. It is also difficult to develop multiple models with significant differences based on a common printed circuit board (PCB) platform. Traditional wireless devices using discrete solution have difficulty supporting multiple band or modes such as GSM, CDMA, 3G. Discrete chipset solutions consume at least three times more PCB space. There are significant financial and technical barriers of entry for new companies without significant resources, or established companies without wireless expertise.

Currently there are some vendors selling modules that can provide wireless communication functions in a particular wireless technology. However these modules are large in size with proprietary interfaces. These modules require significant amount of vendor integration. Alternatively, certain prior art systems are simply modularizing wireless modem functions. Prior art systems for removable cartridges providing communications elements such as that disclosed in U.S. Pat. No. 6,690,947 to Tom provide some flexibility in applications design; however, such systems were bulky and lacked packaging and connector innovations required for practical application of such systems.

U.S. patent application Ser. No. 11/308,221 filed on Mar. 13, 2006 entitled MINIATURIZED FORM FACTOR WIRELESS COMMUNICATIONS CARD FOR GENERIC MOBILE INFORMATION DEVICES, which is incorporated herein by reference in its entirety as though fully set forth, provides a system that can save RF tuning, debugging and certification thereby reducing design lead time significantly. This system provides the ability to integrate hardware, software, utilities and drivers which will allow true plug and play functionality for end users or mobile information device design houses. The desired functional capability is provided through an insertable card to eliminate the requirement for a separate CPU or applications processor in the mobile information device and additionally, provides a complete modem solution that will support multi-mode and multi-band.

However, the integration of circuits requiring significant power into a miniaturized form factor card which is also insertable and removable from the mobile information device presents challenges in heat dissipation. For communications modules in GSM, WCDMA, CDMA and other high power consumption applications, the mobile card power amplifier and baseband components will generate a significant amount of heat. If this heat is not dissipated effectively, the small sized mobile card temperature will be increased dramatically, potentially damaging the card and components in it. Most current systems with removable components rely on the connector elements for the components to provide the heat dissipation connections and capability. This typically requires complex and bulky connectors.

It is therefore desirable to provide high efficiency heat dissipation systems having elements integrated within the miniaturized form factor card and elements integrated in mobile information devices in which the miniaturized form factor cards will be used. It is also desirable that such heat dissipation systems will not interfere with the removable functionality of the card or require overly complex connector systems to dissipate heat.

SUMMARY OF THE INVENTION

The present invention provides a heat dissipation system for a wireless communications card inserted into mobile information devices with user interface components. A connector is mounted on a printed circuit board in the mobile information device to receive insertable miniaturized form factor card incorporating means for RF transmission and reception and a wireless modem. A high conductivity pad is provided on the printed circuit board of the mobile information device adjacent the connector which contacts the case of the miniaturized form factor card. Additionally, heat dissipation plugs are integrated into the edge of the PCB with emitting surfaces adjacent radiation holes in the case of the mobile information device adjacent the PCB. Heat convection channels through layers of the PCB allow transfer of heat from the pad to other conductive layers in the PCB are also employed in certain embodiments.

High thermal conductivity packing is provided within the miniaturized form factor card for conducting heat from the internal components to the case of the card in contact with the high conductivity pad when the card is inserted into the mobile information device. Placement of high heat generation components within the card case adjacent the contact interface with the high conductivity pad is also employed for maximum heat dissipation. Additionally, a high conductivity membrane is provided on the card case for increased conductivity from the case into the pad on the PCB.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

Figure 1:
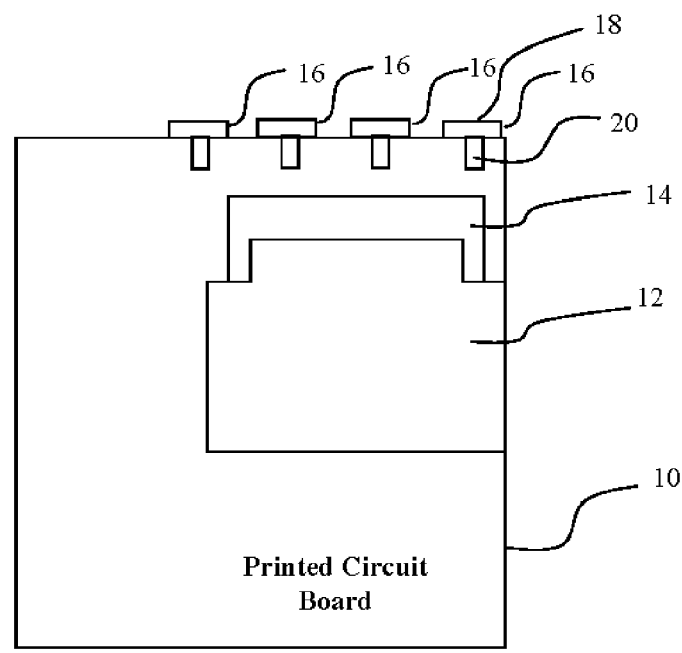
FIG. 1 is a top view of elements of the system of the present invention which reside on the printed circuit board of the mobile information device.

FIG. 1 demonstrates one embodiment of a portion of the elements of the present inventive system employed on a printed circuit board 10 contained in a mobile information device. A bare copper pad 12 is printed on the PCB for close thermal contact with the resin matrix of the board. The pad is located at the insertion location for the miniaturized form factor card employing wireless communications capability for the mobile information device. A connector 14 receives the card upon insertion. The area of the copper pad is determined based on heat generation by the card and the necessary thermal transfer into the PCB matrix. In an exemplary embodiment, to dissipate 2 W heat generated by the card, the area of the copper pad is 30×20 mm with thickness of 0.035 mm. The PCB also includes heat dissipation plugs 16 which include a radiator portion 18 and a sink portion 20 in intimate contact with the resin matrix of the PCB.

Figure 2:
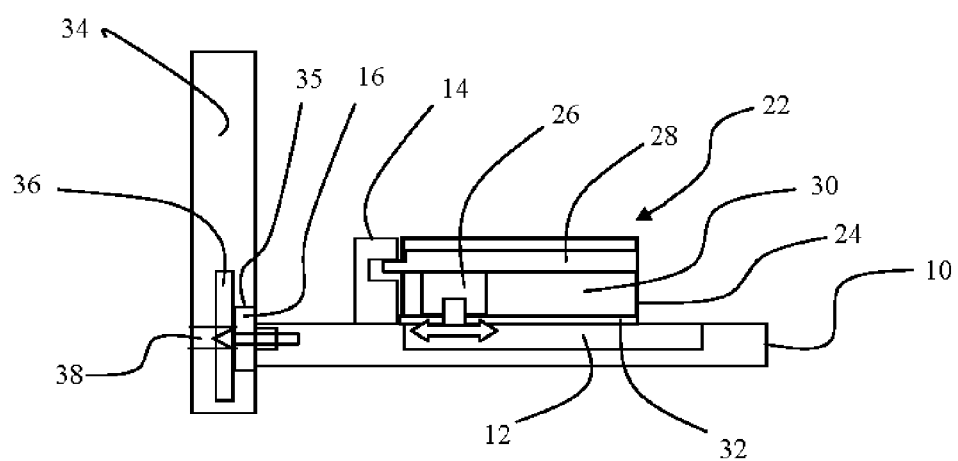
FIG. 2 is a side view of the miniaturized form factor card showing exemplary high power components and the internal elements of the system according to the present invention as well as the elements on the PCB of FIG. 1

As shown in FIG. 2, the miniaturized form factor card 22 (shown engaged in connector 14) incorporates a lower case 24 which is in intimate contact with the bare copper pad for maximum conductive heat transfer. High heat generation components such as the power amplifier 26 are located on a bottom side of the internal printed circuit board 28 in the card. This places those components adjacent the lower case for maximum radiative heat transfer to the case and to the bare copper pad. To dissipate heat generated by all components in mobile card (e.g. PA, RF, Baseband), heat conductive material 30 is packed into the case. This ensures conductive heat transfer between components and miniaturized form factor card case. One exemplary heat conductive stuffing material is part number G32669 from Beijing Doemc Electronic Technology Co., Ltd.

Figure 3:
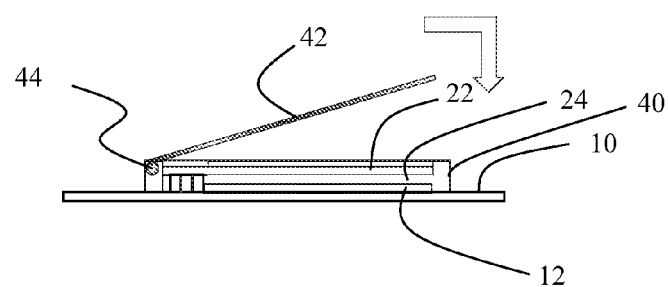

In an exemplary mounting scheme for the miniaturized form factor card as disclosed in U.S. patent application Ser. No. 11/308,559 filed on Apr. 6, 2006 entitled CONNECTOR FOR A HIGHLY INTEGRATED, INSTALLABLE MINIATURIZED FORM FACTOR CARD FOR WIRELESS COMMUNICATIONS FUNCTIONS having a common assignee with the present application, the disclosure of which is incorporated herein by reference, a frame 40 is mounted to the PCB to receive the card 22 as shown in FIG. 3. The frame is mounted on the PCB over the bare copper pad. The frame provides additional thermal mass and radiation capability for heat transfer from the pad. A cover 42 having a hinge 44 rotates for engagement of the upper case of the card and urges the card into intimate contact with the pad for improved conductive thermal transfer.

To enhance contact and heat dissipation between the miniaturized form factor card and the mobile information device PCB, a heat dissipation compound stretch membrane 32, as shown in FIG. 2, such as heat conductive membrane available as part number BP105 from Beijing Doemc Electronic Technology Co., Ltd, is employed in certain embodiments.

Heat conductively transmitted from the bare copper pad through the PCB in the mobile information device is transmitted to the case 34 of the mobile information device using heat dissipation plugs 16. The sink portion of the plugs receives the heat from the PCB and conducts it to the radiator portion. The radiator portion is located adjacent the mobile information device case in certain embodiments or as shown in the embodiment of the drawings, is received in a recess 35 in the case wall and copper contact sheathing 36 is employed in certain embodiments to provide further enhanced conductive transfer to the case. Holes 38 in the case adjacent to the radiation portion of the plugs and contact sheathing enhances the heat conduction through the case.

Figure 4:
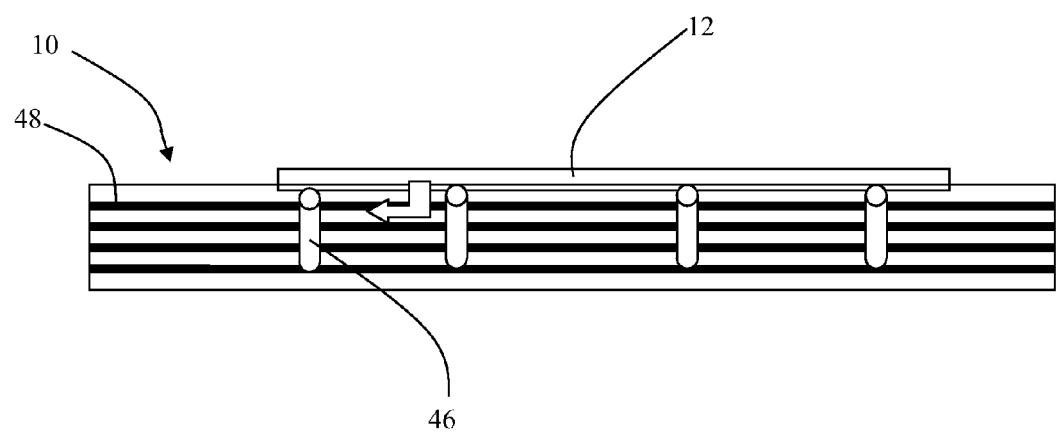

To distribute the heat transferred to the bare copper pad collected from miniaturized form factor card into other layers of the host mobile information device PCB more effectively, mechanically drilled holes or laser drilled holes 46 as shown in FIG. 4 are provided under copper pad 12 for convective heat transfer from the pad into other copper layers 48 of the PCB which then conduct heat to the edges of the PCB for dissipation in the heat dissipation plugs or other radiant, conductive or convective transfer from the PCB.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A heat dissipation system for a wireless communications card inserted into mobile information devices with user interface components, the system comprising:
   a connector mounted on a printed circuit board mounted in the mobile information device to receive an insertable miniaturized form factor card incorporating means for RF transmission and reception and a wireless modem;
   a high conductivity pad integrated on the printed circuit board of the mobile information device adjacent the connector, said pad in intimate contact with a case of the miniaturized form factor card;
   a plurality of heat dissipation plugs integrated into an edge of the PCB with emitting surfaces adjacent a case of the mobile information device on which the PCB is mounted.

2. A heat dissipation system as defined in claim 1 further comprising heat transmission holes through the case of the mobile information device adjacent the plug emitting surfaces.

3. A heat dissipation system as defined in claim 1 further comprising high thermal conductivity packing stuffed within the miniaturized form factor card for conducting heat from the internal components to the case of the card in contact with the high conductivity pad when the card is inserted into the mobile information device.

4. A heat dissipation system as defined in claim 1 wherein high heat generation components of the card are placed within the card case adjacent the contact interface with the high conductivity pad is also employed for maximum heat dissipation.

5. A heat dissipation system as defined in claim 1 further comprising a high conductivity membrane on the card case intermediate the card case and pad for increased conductivity from the case into the pad on the PCB.

6. A heat dissipation system as defined in claim 1 wherein the PCB incorporates multiple conductive layers, said system further comprising a plurality of cylindrical channels in the PCB extending from proximate a bottom surface of the conductive pad through at least one of said conductive layers.

7. A heat dissipation system as defined in claim 1 further comprising a mounting frame having the connector and high conductivity pad encompassed therein and receiving the miniaturized form factor card, the high conductivity pad in thermal connection with the frame.

8. A heat dissipation system as defined in claim 7 further comprising means for engaging the miniaturized form factor card within the frame and urging the card into contact with the high conductivity pad.

9. A heat dissipation system as defined in claim 8 wherein the engaging means comprises a hinged cover.

* * * * *